(12) United States Patent
Wang et al.

(10) Patent No.: US 9,182,660 B2
(45) Date of Patent: Nov. 10, 2015

(54) METHODS FOR ELECTRON BEAM PATTERNING

(75) Inventors: Wen-Chuan Wang, Hsinchu (TW); Shy-Jay Lin, Jhudong Township, Hsinchu County (TW); Jaw-Jung Shin, Hsinchu (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 219 days.

(21) Appl. No.: 13/486,000

(22) Filed: Jun. 1, 2012

(65) Prior Publication Data

US 2013/0323918 A1    Dec. 5, 2013

(51) Int. Cl.
*G03F 1/56* (2012.01)
*G03F 1/78* (2012.01)
*H01L 21/027* (2006.01)
*G03F 7/20* (2006.01)

(52) U.S. Cl.
CPC .. *G03F 1/56* (2013.01); *G03F 1/78* (2013.01); *G03F 7/2063* (2013.01); *H01L 21/0276* (2013.01); *H01L 21/0277* (2013.01)

(58) Field of Classification Search
CPC ................. H01L 21/2026; H01L 21/0276
USPC ................. 438/584; 257/E21.134, E21.333, 257/E21.517; 430/5, 311, 394, 319–322
See application file for complete search history.

(56) References Cited

U.S. PATENT DOCUMENTS

| | | | |
|---|---|---|---|
| 2002/0182514 A1* | 12/2002 | Montgomery et al. | 430/5 |
| 2005/0008945 A1* | 1/2005 | Brooks et al. | 430/5 |
| 2005/0221019 A1* | 10/2005 | Baik et al. | 427/487 |
| 2008/0274431 A1* | 11/2008 | Nozaki et al. | 430/319 |
| 2008/0315112 A1* | 12/2008 | Wiesner | 250/396 R |
| 2009/0057577 A1* | 3/2009 | Parker | 250/492.23 |
| 2009/0130476 A1* | 5/2009 | Li et al. | 428/611 |
| 2009/0155698 A1* | 6/2009 | Yamada et al. | 430/5 |
| 2009/0168043 A1* | 7/2009 | Lee | 355/77 |
| 2010/0009536 A1* | 1/2010 | Ghandehari et al. | 438/689 |
| 2011/0076843 A1* | 3/2011 | Huang et al. | 438/585 |
| 2012/0129084 A1* | 5/2012 | Yamada et al. | 430/5 |
| 2012/0157367 A1* | 6/2012 | Duong et al. | 510/176 |

OTHER PUBLICATIONS

Resist charging in electron-beam lithography, Bai et al, 1998.*
Unpublished U.S. Appl. No. 13/051,507, filed Mar. 18, 2011 entitled "Systems and Methods Providing Electron Beam Writing to a Medium", 24 pages.

* cited by examiner

*Primary Examiner* — Yu-Hsi D Sun
*Assistant Examiner* — Ankush Singal
(74) *Attorney, Agent, or Firm* — Haynes and Boone, LLP

(57) ABSTRACT

A method for electron-beam patterning includes forming a conductive material layer on a substrate; forming a bottom anti-reflective coating (BARC) layer on the conductive material layer; forming a resist layer on the BARC layer; and directing an electron beam (e-beam) to the sensitive resist layer for an electron beam patterning process. The BARC layer is designed such that a top electrical potential of the resist layer is substantially zero during the e-beam patterning process.

20 Claims, 4 Drawing Sheets

METHODS FOR ELECTRON BEAM PATTERNING

BACKGROUND

Semiconductor integrated circuit (IC) technology is continually progressing to circuit layouts having smaller feature sizes as well as increased density. As a result of this continuous progression, photolithography equipment has continually become more expensive and more complex. An electron-beam (or "e-beam") technique is used to pattern a substrate.

E-beam patterning relates to a process for creating changes in a medium using e-beams. Specifically, some e-beam processes use e-beams to write design patterns onto a resist layer. E-beam patterning provides a way to create features on a substrate where the features are smaller than a resolution limit for light.

However, one issue with e-beam writing is that the resists used for e-beam writing lithography are insulating polymers. Consequently, charges trapped in the resist generate change of the surface potential which deflects incoming electrons and lead to pattern placement error. Currently, the surface potential removal effort is focused mainly on the trapped charge, through conducting layer coating. Treatments on resist such as conducting layer coating or resist thickness adjustment, which essentially disturb the imaging layer, would induce imaging quality degradation and imply more effort on imaging quality optimization.

Therefore, what is needed is a method to address the above issue with improved e-beam patterning performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor manufacturing. Specifically, the present disclosure relates to e-beam patterning methods. While the examples herein discuss applying the techniques to write to photolithographic masks and semiconductor wafers, it is understood that the scope of embodiments can include any appropriate medium using e-beam technology.

The following disclosure provides many different embodiments, or examples, for implementing different features of the invention. Specific examples of components and arrangements are described below to simplify the present disclosure. These are, of course, merely examples and are not intended to be limiting.

Figure 1:
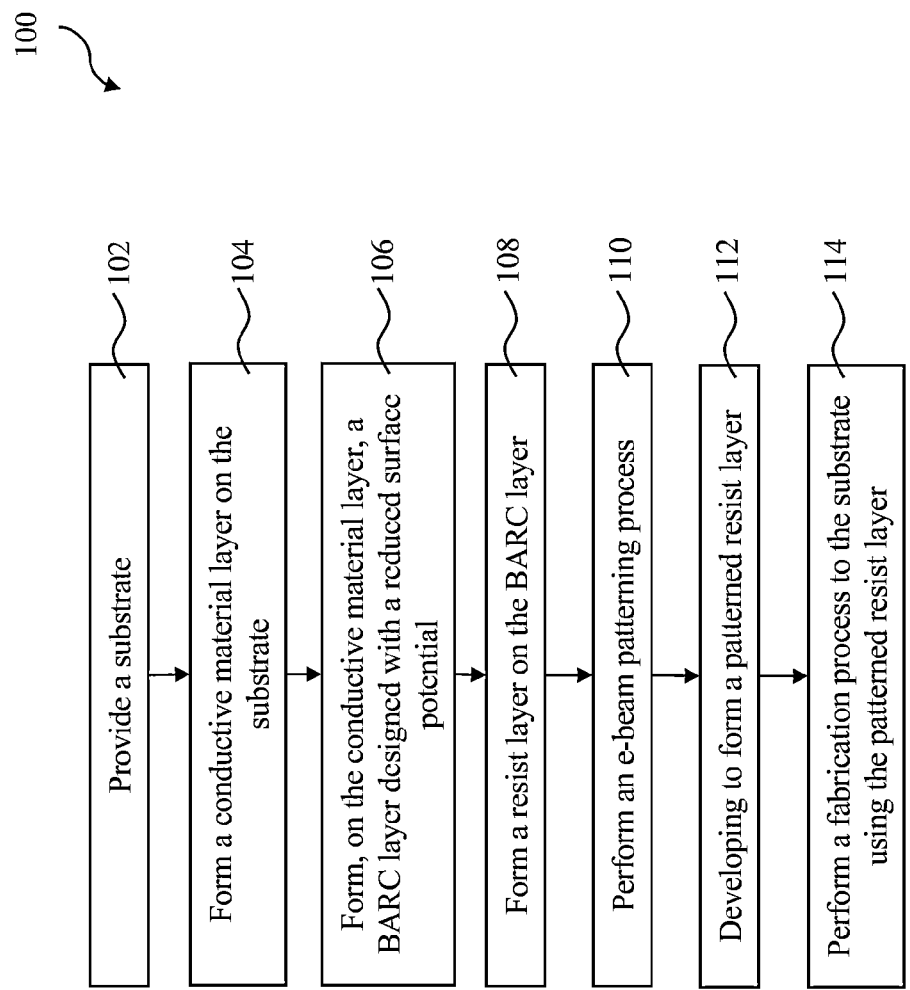
FIG. 1 is a flowchart of a method for e-beam lithography patterning constructed according to aspects of the present disclosure in one or more embodiments.
Figure 2:
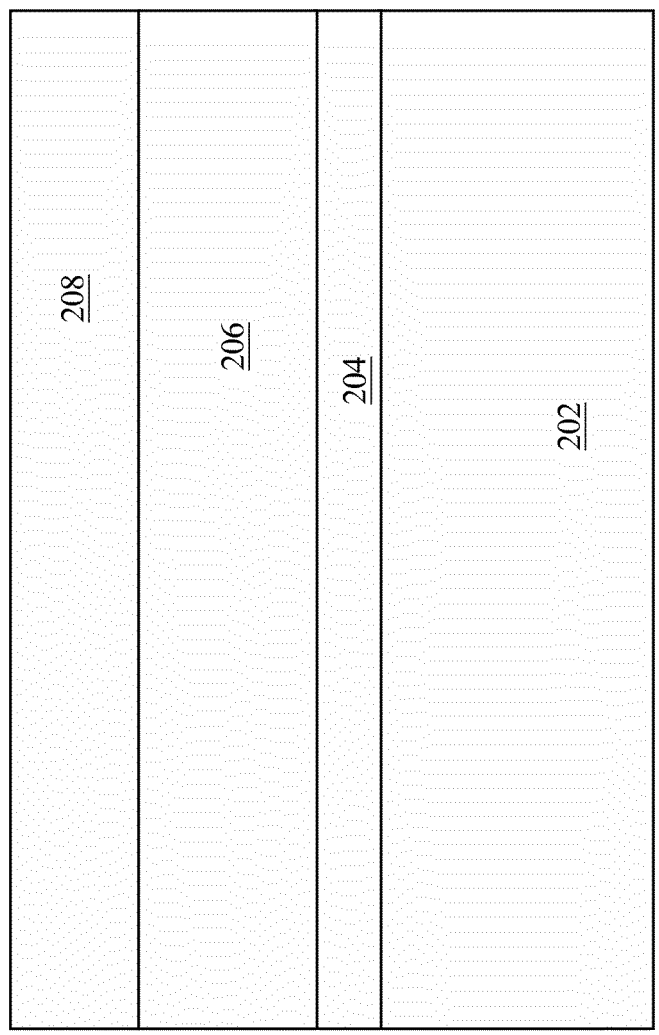
FIG. 2 is a sectional view of a substrate patterned by the method of FIG. 1 constructed according to aspects of the present disclosure in one or more embodiments.
Figure 3:
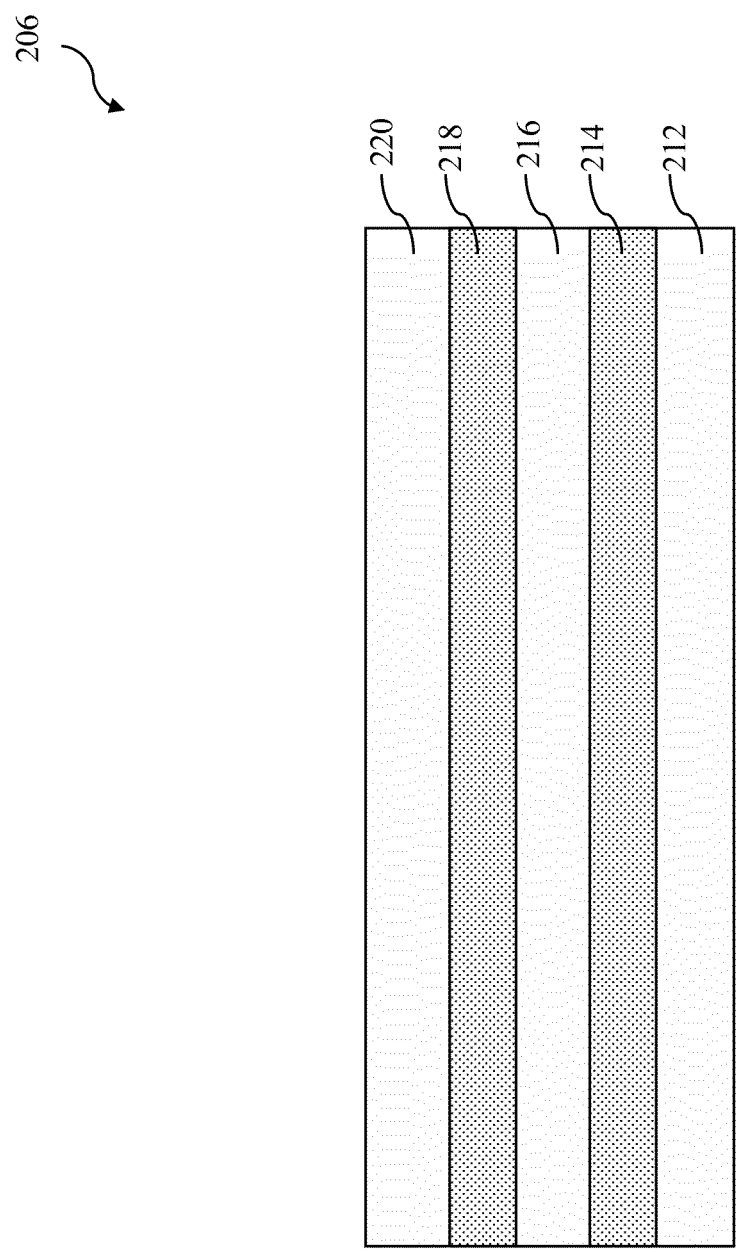
FIG. 3 is a fragmentary sectional view of the substrate of FIG. 2 constructed according to aspects of the present disclosure in one or more embodiments.

FIG. 1 is a flowchart of a method 100 for e-beam lithography patterning constructed according to aspects of the present disclosure in one or more embodiments. FIG. 2 is a sectional view of a substrate 200 patterned by the method 100. FIG. 3 is a sectional view of the substrate 200 in portion. The method 100 and substrate 200 are collectively described with reference to FIGS. 1 through 3.

The method 100 begins at step 102 where a substrate 202 is provided. In one embodiment, the substrate 202 is a semiconductor substrate, such as a semiconductor wafer or other suitable structure with an integrated circuit formed or to be formed thereon. In one example, the semiconductor substrate includes a silicon substrate having various doped regions, dielectric features, and/or multilevel interconnects. The semiconductor substrate may alternatively include other suitable semiconductor material, including Ge, SiGe, or GaAs. The semiconductor substrate may include various doped features configured to form functional devices, such as field effect transistors, diodes, resistors, and/or capacitors. The semiconductor substrate may further include interconnect structure coupled with the doped features and configured to form an integrated circuit. In one example, the semiconductor substrate includes one material layer to be patterned, such to a semiconductor layer, a dielectric layer or a metal layer. Patterning of the material layer includes etching the respective material layer according to a design pattern of the integrated circuit.

The substrate 202 may alternatively include other material, such as a photomask blank. In one embodiment, the substrate 202 is a photomask (reticle) that includes a transparent substrate of fused quartz ($SiO_2$), calcium fluoride ($CaF_2$), or other suitable material. The mask further includes an absorption layer formed on the transparent substrate, using chromium (Cr) and/or MoSi. In various embodiments, the absorption layer may alternatively include Cr, MoSi, iron oxide, or an inorganic film made with MoSi, ZrSiO, SiN, $MoSiON_x$, and/or TiN. The absorption layer may have a multilayer structure. For example, the absorption layer may include a layer of Cr film and a layer of MoSi film. The mask may further include patterned features (shifters) formed on/in the substrate to phase-shift a radiation beam passing through. In one embodiment, the shifters may include areas in which the substrate is partially etched such that the radiation beam through these areas has a predefined phase shift, such as about a 180 degree shift relative to areas not etched. In another embodiment, the shifters may be integrated with the absorption layer. For example, a MoSiON layer may be coated on the substrate to provide partial absorption and a phase shift to a radiation beam. In one example, the photomask includes one material layer to be patterned using the method 100.

In yet another embodiment, the photomask is a reflective and is designed for extreme ultraviolet (EUV) lithography. In this case, the may includes a suitable substrate with a reflective mechanism, such as a Mo/Si multilayer material stack that acts to reflect light by means of multi-film interference. The photomask may further include an absorption layer and a protection layer. In one example, the photomask is at fabrication stage that one material layer is to be patterned by the method 100.

In other embodiments, the substrate 202 includes other type substrate to be patterned by the method 100. In one example, the substrate 202 includes a glass plate for thin-film-transistor liquid crystal display (TFT-LCD) devices, flat panel substrate.

The method proceeds to step 104 by forming a conductive material layer 204 on the substrate 202.

The conductive layer 204 serves is thus disposed as an isolation from the topography influence of the underlying layers formed by previous processes. In one embodiment, the conductive material layer 204 serves as a shielding layer to shield the impact electrical charges from the underlying material or the substrate 202. In one embodiment, the conductive material layer 204 may include doped polysilicon, metal, metal alloy or combination thereof. The conductive material layer 204 is formed by a suitable technology, such as physical vapor deposition (PVD), chemical vapor deposition (PVD), or plating. In another embodiment, the conductive material layer 204 may be a conductive material layer to be patterned, such as a gate electrode layer made of polysilicon, metal or combination thereof.

In one embodiment, the conductive material layer 204 is configured to be grounded such that the electrical potential of the conductive material layer 204 is zero. For example, the conductive material layer 204 is connected to the substrate through one or more conductive features in the interconnect structure or doped features in the substrate. In another example, the conductive material layer 204 is grounded during the subsequent patterning process through directly contacting to a conductive component of an e-beam lithography tool for e-beam patterning during the subsequent e-beam patterning process.

In another embodiment, the conductive material layer 204 is floating but the electrical potential of the conductive material layer 204 is maintained substantially zero. In one example, this may be done by a cleaning process to neutralize the charges in the conductive material layer such that the conductive material layer 204 has an electrical potential substantially zero.

The method proceeds to step 106 by forming a dielectric material layer 206 on the conductive material layer 204. In the present embodiment, the dielectric material layer 206 is a bottom anti-reflective coating (BARC) layer functioned for anti-reflection during a subsequent patterning process, such as e-beam writing. Specifically, the BARC layer serves to reduce the reflection of the electrons from the e-beam directed to the substrate during the subsequent e-beam patterning process.

Additionally, the dielectric material layer 206 is designed with a particular dielectric constant and a particular thickness such that the electrical potential of the resist layer at the top surface is substantially zero. In another example, the dielectric material layer 206 includes a stack of multiple dielectric films designed with particular dielectric constants and thicknesses such that the electrical potential of the resist layer at the top surface is substantially zero. The dielectric material layer 206, including the materials, dimensions and the method to achieve the same, will be further described after the resist layer is introduced.

The method 100 proceeds to step 108 by forming a resist layer 208 on the dielectric material layer 206. The resist layer 208 is an e-beam resist sensitive to e-beam. The resist layer 208 includes a matrix material resist to etch or implantation. The resist layer 208 also includes an electron-sensitive component dispersed in the matrix material. The resist layer 208 may further include a solvent mixed with the matrix material and the electron-sensitive component. In various embodiment, the resist layer 208 includes a positive tone resist or a negative tone resist. In one example, the resist layer 208 includes polymethyl methacrylate (PMMA). The resist layer 208 is coated on the substrate 202 by a suitable technique, such as spin-coating. Other step may be further implemented after the coating of the resist layer 208. For example, a baking process may be applied to the resist layer 208 to partially drive out the solvent from the resist layer 208.

The charges in the dielectric materials can deflect the e-beam and cause the placement error. The disclosed method provides an approach to cancel the charge effect from the multiple dielectric layers instead of coating a conductive layer on the top of the resist layer 208. During the e-beam patterning (such as e-beam writing) process, electron charges are trapped in the resist layer 208 and the dielectric layer 206. Positive charges are induced on a top portion of the resist layer 208. The electrical voltage is built up accordingly. However, by properly designing the dielectric constants and thickness of various dielectric materials, the contributions to electrical voltage from the positive charges and the negative charges are able to cancel each other such that the electrical voltage of the resist layer 208 at the top surface is substantially zero.

The resist layer 208 has a dielectric constant and a thickness. The resist material is selected according to characteristics of the e-beam and the characteristics of the IC fabrication process (such as etching or implantation) applied to the substrate 202 through the patterned resist layer 208. Furthermore, the thickness of the resist layer 208 is also determined according to the similar factors. Therefore, there is no much room for tuning the dielectric constant and the thickness of the resist layer 208 according to other factors.

The dielectric layer 206 is designed with a particular dielectric constant and a particular thickness such that the electrical potential of the resist layer at the top surface is substantially zero. In one example, the dielectric material layer 206 includes a stack of multiple dielectric films designed with particular dielectric constants and thicknesses such that the electrical potential of the resist layer at the top surface is substantially zero.

FIG. 3 illustrates the dielectric layer 206 constructed according to aspects of the present disclosure in one embodiment. In one embodiment, the dielectric layer 206 includes single or multiple BARC films underlying the resist layer 208, each BARC film with adjustable film thickness and variable material.

In another embodiment, the dielectric layer 206 includes one or more dielectric films, such as exemplary dielectric films 212, 214, 216, 218 and 220. Generally, the dielectric layer 206 and the resist layer 208 includes n dielectric films, 1, 2, 3, ..., i, ..., and n. The parameter n is an integer number, such as 1, 2, and so on. Each dielectric film has a respective dielectric constant and a respective thickness. Take the dielectric film "i" as an example, the dielectric film "i" has a respective relative static permittivity (or relative dielectric constant, labeled as $\in ri$) and a respective thickness (e.g., di).

Assuming the electrical potential of the conductive material layer 204 being zero, the electrical potential $\Phi$ of the resist layer 208 at the top surface is determined by the combined effect of the positive charge from secondary electron emission ($Q_p$) and the trapped negative charges from primary electrons ($Q_n$) as $$\Phi = \frac{Q_p}{C_p} - \frac{Q_n}{C_n},$$

In the above formula, $C_p$ is the collective capacitance of the dielectric layer 206 and the resist layer 208 regarding to the positive charges and its distribution; and $C_n$ is the collective capacitance of the dielectric layer 206 and the resist layer 208 regarding to the negative charges. The two terms in the above equation compete with each other. By adjusting the dielectric constants and thicknesses of the dielectric films, the two terms can be tuned to cancel each other. State differently, by proper adjustment of the capacitance or proper combinations of the dielectric films and the respective thickness, the electrical potential Φ of the resist layer 208 at the top surface is tuned to zero or close to zero and the pattern placement error for imaging a pattern layout is reduced or eliminated. Thus, the charging effect is overcame without coating with a conductive material on the resist layer 208 or adjusting the thickness of the resist itself.

In one situation, the positive charge usually distributes on the top surface of the resist layer 208 while the negative charges distributes in the resist layer 208 and the dielectric layer 206. In this situation, the electrical potential Φ of the resist layer 208 at the top surface is determined by $$\Phi = \frac{Q_p}{C_p} - \sum \frac{Q_{ni}}{C_{ni}},$$

In this case, the parameter $Q_{ni}$ is the negative charge in the dielectric film "i" and the $C_{ni}$ is the capacitance of the respective film regarding to the negative charge. Further, $C_p$ is expressed as $$C_p = \sum_{i=1} \varepsilon_0 \varepsilon_{ri} \frac{A}{d_i},$$

and $C_{ni}$ is related to the factors of dielectric constants and the material thicknesses as $$C_{ni} \propto \varepsilon_0 \varepsilon_{ri} \frac{A}{d_i},$$

where A is the area of infinite charged sheet; $\varepsilon_0$ is the vacuum electric constant. As noted above, $\varepsilon_{ri}$ is the relative dielectric constant and di is the film thickness of the respective dielectric film "i".

Specifically, the capacitances $C_{ni}$ are given and the electrical potential Φ of the resist layer 208 at the top surface is expressed as below, $$\Phi = \sigma_p \sum_{i=1}^{n} \frac{d_i}{\varepsilon_0 \varepsilon_{ri}} +$$
$$\left[ \frac{1}{\varepsilon_0 \varepsilon_{r1}} \int_0^{d1} \rho_{n1}(x) x dx + \sum_{i=1}^{n-1} \frac{1}{\varepsilon_0 \varepsilon_{ri+1}} \int_{di}^{di+1} \rho_{ni+1}(x) x dx \right]$$

In the formula, $\sigma_p$ is positive charge area density and is given as $\sigma_p = Q_p/A$. The parameter $\rho_{ni+1(x)}$ is the negative charge volume density and is depth dependent. The charge parameters $\sigma_p$= and $\rho_{ni+1(x)}$ are related to the e-beam patterning (e-beam writing) process. The resist layer 208 is also determined considering other factors, such as etch resistance, leaving the freedom on the rest parameters including the relative dielectric constants and thicknesses of the various films in the dielectric layer 206. Thus, the surface potential Φ is able to be modulated to zero (Φ=0) or near zero by proper choosing, tuning and adjusting the number of films, relative dielectric constants and thicknesses of the films in the dielectric layer 206, instead of removing the charge or adjusting the thickness of the resist layer 206. In other words, the dielectric layer 206 is tuned to meet the condition Φ=0.

In one embodiment, each film (e.g., film "i") of the dielectric layer 206 has a thickness ranging between about 0.05 micron and about 1 micron. In another embodiment, each film (e.g., film "i") of the dielectric layer 206 has a relative dielectric constant ranging between about 2 and about 3.5.

In another embodiment, the BARC layer as the dielectric layer 206 includes two dielectric materials disposed in an alternating way. Thus, the dielectric layer 206 includes a plurality of films with two dielectric materials, first dielectric material and second dielectric material. Except for the films on the top and on the bottom, each film of the first dielectric material is between two films of the second dielectric material and each film of the second dielectric material is between two films of the first dielectric material. The dielectric constants of the two dielectric materials are different from each other.

Referring to FIG. 3, films 212, 216 and 220 include the first dielectric material and films 214 and 218 include the second dielectric material according to one example.

In one example, the first dielectric material includes PMMA ($C_5O_2H_8$) with a relative dielectric constant of about 3.5 and the second dielectric material includes ZEP520 ($C_6H_4Cl_2$) with a relative dielectric constant of about 2.8.

Still referring to FIG. 1, the method 100 proceeds to step 110 by performing an e-beam patterning process, such as an e-beam writing or e-beam exposure. The e-beam writing process may be implemented in a raster scan mode or a vector scan mode. The e-beam may be Gaussian beam or shaped beam. The e-beam patterning process may utilize single beam or multi-beam e-beam writing. In one embodiment, the e-beam is applied to the resist layer in a writing-mode according to a design layout, such as an integrated circuit design layout. In another embodiment, the e-beam is applied to the resist layer in a projection-mode.

The e-beam writing is implemented by an e-beam writing apparatus that includes one or more writing chambers. The writing chamber has a wafer stage designed operable to secure and manipulate a substrate (or a wafer) during the patterning process. The e-beam patterning (or writing) process is implemented using a certain e-beam intensity and dose. During the e-beam patterning process, electrons are trapped in the dielectric materials including the dielectric layer 206 and the resist layer 208. The positive surface charge is also induced, such as by second electron emission. Those negative charge and the positive charge usually create an electrical field and electrical potential that will deflect the e-beam, causing the distortion imaging and degrading the lithography patterning quality. However, in the present method 100, the dielectric layer 206 is designed such that the electrical potential of the resist layer at the top surface is zero is near zero, the charge effect is eliminated or reduced. In one embodiment, another baking step, such as post exposure baking (PEB) may be followed.

Still referring to FIG. 1, the method 100 proceeds to step 112 by developing the resist layer 208 after the lithography patterning process at step 110. At step 112, a developing solution is applied to the resist layer 208 such that the e-beam exposed region is removed (referred to as positive tone imaging) or alternatively the unexposed region is removed (referred to as negative tone imaging). In one example, the BARC layer 206 is removed by the developing solution as well. In another example, a second solution is used to subsequently remove the BARC layer 206. In another example, the conductive layer 204 is removed by the developing solution as well. In another example, the conductive layer 204 is removed by an etch process.

Still referring to FIG. 1, the method 100 may proceed to step 114 by performing a fabrication process to the substrate 202 using the patterned resist layer 208 as a mask. In one embodiment, the fabrication process is an etch process. In this case, the patterned resist layer 208 serves as an etch mask. The underlying material layer is selectively etched through the openings of the patterned resist layer 208 while the portion of the underlying material covered by the resist layer remains. In another embodiment, the conductive layer 204 is the underlying layer to be patterned by the etch process. For example, the conductive layer 204 includes various conductive materials (such polysilicon, metal or silicide) for gate electrodes for a semiconductor wafer. Then conductive layer 204 is patterned by the etch process.

In another embodiment, the fabrication process is an ion implantation process. The patterned resist layer 208 is used as an implantation mask. After the fabrication process, the resist layer 204 may be removed by a suitable technique, such as stripping or ashing. The BARC layer 206 (and the conductive layer 204) may be removed by the same procedure as well.

Figure 4:
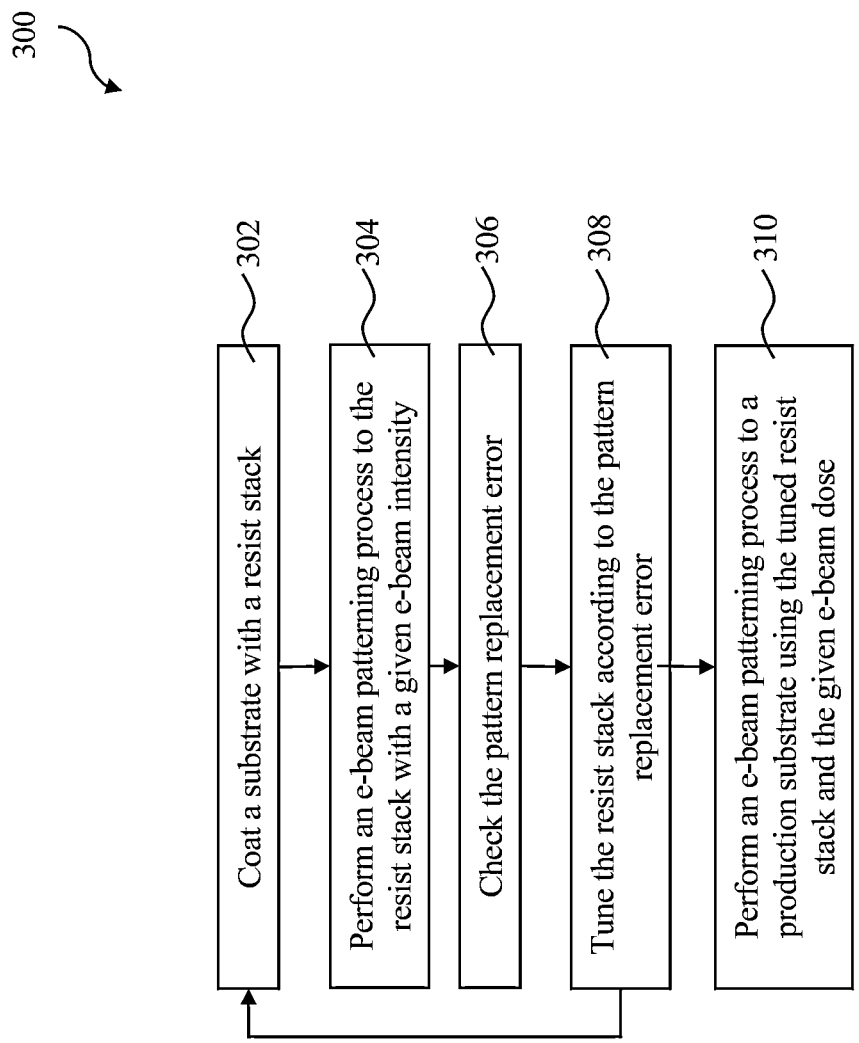
FIG. 4 is a flowchart of a method for e-beam patterning constructed according to aspects of the present disclosure in one or more embodiments.

As noted earlier, the present method 100 includes coating a dielectric layer 206 designed to eliminate the charge effect. Tuning, choosing and adjusting of the dielectric layer 206 may be implemented in various approaches. FIG. 4 is a flowchart of a method 300 for tuning the dielectric layer (or BARC layer) 206, constructed according to one embodiment.

The method 300 includes a step 302 by coating a resist stack that includes the conductive layer and the BARC layer and the resist layer, similar to the steps 104, 106 and 108 of the method 100. The method 300 proceeds to step 304 by performing an e-beam patterning process with the e-beam dose to be used for pattering a production substrate. Step 304 further includes developing the resist layer 208, resulting in a patterned resist layer. Step 304 is similar to the step 110 and 112 of the method 100.

The method 300 proceeds to step 306 by checking the pattern placement error. During this step, if any charge induced deflection, the patterned features on the resist layer will present a placement error. By checking the pattern placement error, the charge issue is evaluated.

The method 300 then proceeds to step 308 by tuning the resist stack based on the placement error. Particularly, tuning the BARC layer includes tuning the number of BARC films, film compositions, film thicknesses or a combination thereof.

In the method 300, the steps from 302 to 308 may be iterated as many times as needed until the placement error is with a tolerable range.

The method 300 may further include a step 310 by performing an e-beam lithography patterning process to a production substrate using the tuned BARC layer and the used e-beam dose (or e-beam intensity or both). For example, step 310 is similar to the method 100 that includes various e-beam lithography patterning steps from 104 to 114.

The disclosed e-beam patterning processes provide an effective way to create designs on a physical medium where some of the features of the design may be too small to be made by other conventional processes, such as photolithography. Particularly, the without coating an additional conductive layer on the resist layer or adjusting the thickness of the resist itself, the charging effect and the associated pattern placement error is reduced. The imaging quality degradation is avoided.

The scope of embodiments is not limited to the examples shown in various figures. Other embodiments may add, omit, rearrange, or modify actions. Various changes, substitutions and alterations can be made herein without departing from the spirit and scope of the present disclosure. For instance, e-beam patterning may not be limited to e-beam writing and may implement e-beam exposure or a combination thereof. Furthermore, other embodiments include subsequent processing steps appropriate for a photomask, semiconductor wafer, or other substrate. Some embodiments employ Gaussian beams, whereas other embodiments employ shaped beams.

Thus, the present disclosure provides a method according to one embodiment. The method includes forming a conductive material layer on a substrate; forming a bottom anti-reflective coating (BARC) layer on the conductive material layer; forming a resist layer on the BARC layer; and directing an electron beam (e-beam) to the resist layer for an e-beam patterning process. The BARC layer is designed such that a top electrical potential $\Phi$ of the resist layer is substantially zero during the e-beam patterning process.

In one embodiment, the BARC layer includes at least one dielectric film with respective dielectric constant and thickness.

In another embodiment, the BARC layer and the resist layer includes a plurality of films; and the BARC layer is designed such that $\Phi$ is substantially zero, wherein $\Phi$ is defined by $$\Phi = \frac{Q_p}{C_p} - \sum \frac{Q_{ni}}{C_{ni}},$$

wherein $\Phi$ is an electrical potential of the resist layer at a top surface; $Q_p$ is a positive charge in the resist layer; $Q_{ni}$ is a negative charge of in a "i" film; $C_p$ is a capacitance of the BARC layer and the resist layer regarding to the positive charge; $C_{ni}$ is a capacitance of the "i" film; and "i" is an integer number.

In furtherance of the embodiment, $\Phi$ is defined by $$\Phi = \sigma_p \sum_{i=1}^{n} \frac{d_i}{\varepsilon_0 \varepsilon_{ri}} + \left[ \frac{1}{\varepsilon_0 \varepsilon_{r1}} \int_0^{d1} \rho_{n1}(x) dx + \sum_{i=1}^{n-1} \frac{1}{\varepsilon_0 \varepsilon_{ri+1}} \int_{di}^{di+1} \rho_{ni+1}(x) dx \right]$$

wherein $\sigma_p$ is positive charge area density; $\rho_{ni+1(x)}$ is negative charge volume density; $\varepsilon_0$ is the vacuum electric constant; $\varepsilon_{ri}$ is a relative dielectric constant of the "i" film; and di is a film thickness of the "i" film.

In another embodiment, each of the film has a dielectric constant ranging between about 2 and about 3.5. In yet another embodiment, each of the film has a thickness ranging between about 0.05 micron and about 1 micron.

In yet another embodiment, the BARC layer includes a first dielectric material of a first dielectric constant and a second dielectric material of a second dielectric constant different from the first dielectric constant. In furtherance of the embodiment, the first dielectric material includes includes PMMA ($C_5O_2H_8$); and the second dielectric material includes ZEP520 ($C_6H_4Cl_2$).

In yet another embodiment, the e-beam includes one of a Gaussian beam and a shape beam. In one example, the e-beam includes a plurality of Gaussian beams. In another example, the e-beam includes a plurality of shaped beams.

In yet another embodiment, the substrate is selected from one of a semiconductor wafer, a mask blank and a flat panel substrate. In yet another embodiment, the resist is an e-beam resist and is selected from one of a positive tone resist and a negative tone resist.

The present disclosure also provides an embodiment of a method for electron-beam patterning. The method includes forming a conductive material layer on a substrate; forming a multi-film dielectric layer on the conductive material layer; forming a resist layer on the multi-film dielectric layer; and performing an electron beam (e-beam) writing process to the resist layer, wherein the multi-film dielectric layer is designed with respective dielectric constant and thickness such that a top electrical potential of the resist layer is substantially zero to reduce pattern placement error during the e-beam writing process.

In one embodiment, the multi-film dielectric layer includes a first dielectric material film of a first dielectric constant and a second dielectric material film of a second dielectric constant different from the first dielectric constant. In another embodiment, the first dielectric material film has a first thickness and the second dielectric material film has a second thickness different from the first thickness. The first dielectric material film may include PMMA ($C_5O_2H_8$); and the second dielectric material film may include ZEP520 ($C_6H_4Cl_2$).

The multi-film dielectric layer and the resist layer includes a plurality of films; and the multi-film dielectric layer is designed such that $\Phi$ is substantially zero, wherein $\Phi$ is defined by $$\Phi = \frac{Q_p}{C_p} - \sum \frac{Q_{ni}}{C_{ni}},$$

wherein $\Phi$ is an electrical potential of the resist layer at a top surface;
$Q_p$ is a positive charge in the resist layer;
$Q_{ni}$ is a negative charge of in a "i" film;
$C_p$ is a capacitance of the multi-film dielectric layer and the resist layer regarding to the positive charge;
$C_{ni}$ is a capacitance of the "i" film; and
"i" is an integer number.

The present disclosure also provide another embodiment of a method that includes forming a conductive material layer on a substrate; forming a bottom anti-reflective coating (BARC) layer on the conductive material layer; and forming an e-beam sensitive resist layer on the BARC layer; and performing an e-beam patterning process to the e-beam sensitive resist layer. The BARC layer includes a plurality of dielectric films each having a respective dielectric constant different from those of the rest dielectric films.

In this method, the BARC layer is designed such that a top electrical potential $\Phi$ of the e-beam sensitive resist layer is substantially zero during the e-beam patterning process.

In one embodiment, the BARC layer includes a first dielectric film having a first dielectric constant and a first film thickness; and a second dielectric film having a second dielectric constant and a second film thickness. The second dielectric constant is different from the first dielectric constant, and the second film thickness is different from the first film thickness.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for electron-beam patterning, the method comprising:
   forming a conductive material layer on a substrate;
   forming a bottom anti-reflective coating (BARC) layer with a selected capacitance and thickness on the conductive material layer, wherein the BARC layer includes a first dielectric material film of a first dielectric constant and a second dielectric material film of a second dielectric constant different from the first dielectric constant, wherein the BARC layer further includes a third dielectric material film having a third dielectric constant, wherein the second dielectric constant is different than the third dielectric constant;
   forming a resist layer on the BARC layer; and
   patterning the resist layer by directing an electron beam (e-beam) to the resist layer,
   wherein the BARC layer is selected such that a top electrical potential $\Phi$ of the resist layer is substantially zero during the e-beam patterning process.

2. The method of claim 1, wherein:
   the first dielectric material includes PMMA ($C_2O_2H_8$); and
   the second dielectric material includes ZEP520 ($C_6H_4Cl_2$).

3. The method of claim 1, wherein the e-beam includes one of a Gaussian beam and a shape beam.

4. The method of claim 1, wherein the e-beam includes a plurality of Gaussian beams.

5. The method of claim 1, wherein the e-beam includes a plurality of shaped beams.

6. The method of claim 1, wherein the substrate is selected from one of a semiconductor wafer, a mask blank, and a flat panel substrate.

7. The method of claim 1, wherein the resist is an e-beam resist and is selected from one of a positive tone resist and a negative tone resist.

8. The method of claim 1, wherein the second dielectric material film is formed over and physical contacts the first dielectric material film and the third dielectric material film is formed over a physically contacts the second dielectric material film.

9. The method of claim 1, wherein the first and third dielectric constants are the same.

10. A method for electron-beam patterning, the method comprising:
   forming a conductive material layer on a substrate;
   forming a bottom anti-reflective coating (BARC) layer on the conductive material layer; forming a resist layer on the BARC layer; and
   directing an electron beam (e-beam) to the resist layer for an e-beam patterning process,
   wherein the BARC layer is designed such that a top electrical potential $\Phi$ of the resist layer is substantially zero during the e-beam patterning process;
   wherein the BARC layer includes at least one dielectric film with respective dielectric constant and thickness; and
   wherein:
   the BARC layer and the resist layer include a plurality of films; and the BARC layer is designed such that Φ is substantially zero, wherein Φ is defined by $$\Phi = \frac{Q_p}{C_p} - \sum \frac{Q_{ni}}{C_{ni}},$$

wherein
Φ is an electrical potential of the resist layer at a top surface;
$Q_p$ is a positive charge in the resist layer;
$Q_{ni}$ is a negative charge of in an "i" film;
$C_p$ is a capacitance of the BARC layer and the resist layer regarding to the positive charge;
$C_{ni}$ is a capacitance of the "i" film; and
"i" is an integer number.

11. The method of claim 10, wherein Φ is defined by $$\Phi = \sigma_p \sum_{i=1}^{n} \frac{d_i}{\varepsilon_0 \varepsilon_{ri}} + \left[ \frac{1}{\varepsilon_0 \varepsilon_{r1}} \int_0^{d1} \rho_{n1}(x) x dx + \sum_{i=1}^{n-1} \frac{1}{\varepsilon_0 \varepsilon_{ri+1}} \int_{di}^{di+1} \rho_{ni+1}(x) x dx \right]$$

wherein
$\sigma_p$ is positive charge area density;
$\rho_{ni+1(x)}$ is negative charge volume density;
$\varepsilon_0$ is a vacuum electric constant;
$\varepsilon_{ri}$ is a relative dielectric constant of the "i" film; and
di is a film thickness of the "i" film.

12. The method of claim 10, wherein each of the films has a dielectric constant ranging between about 2 and about 3.5.

13. The method of claim 10, wherein each of the films has a thickness ranging between about 0.05 micron and about 1 micron.

14. A method for electron-beam patterning, the method comprising:
forming a conductive material layer on a substrate;
forming a multi-film dielectric layer with a selected capacitance and thickness on the conductive material layer, wherein the multi-film dielectric layer includes a first dielectric material film having a first thickness and a first dielectric constant, a second dielectric material film having a second thickness and a second dielectric constant different from the first dielectric constant, and a third dielectric material film having a third dielectric constant, wherein the second dielectric constant is different than the third dielectric constant;
forming a resist layer on the multi-film dielectric layer; and
performing an electron beam (e-beam) writing process to the resist layer,
wherein the first and second dielectric constants and the first and second thicknesses are selected such that a top electrical potential of the resist layer is substantially zero to reduce pattern placement error during the e-beam writing process.

15. The method of claim 14, wherein the first dielectric material film has a first thickness and the second dielectric material film has a second thickness different from the first thickness.

16. The method of claim 14, wherein:
the multi-film dielectric layer is designed such that Φ is substantially zero, wherein Φ is defined by $$\Phi = \frac{Q_p}{C_p} - \sum \frac{Q_{ni}}{C_{ni}},$$

wherein
Φ is an electrical potential of the resist layer at a top surface;
$Q_p$ is a positive charge in the resist layer;
$Q_{ni}$ is a negative charge in an "i" film;
$C_p$ is a capacitance of the multi-film dielectric layer and the resist layer regarding to the positive charge;
$C_{ni}$ is a capacitance of the "i" film; and
"i" is an integer number.

17. A method, comprising:
forming a conductive material layer on a substrate;
forming a bottom anti-reflective coating (BARC) layer on the conductive material layer with a selected dielectric constant and thickness, wherein the BARC layer includes a first dielectric film having a first dielectric constant, a second dielectric film having a second dielectric constant, and a third dielectric material film having a third dielectric constant, wherein the second dielectric constant is different from the first dielectric constant, wherein the second dielectric constant is different than the third dielectric constant;
forming an e-beam sensitive resist layer on the BARC layer; and
performing an e-beam patterning process to the e-beam sensitive resist layer.

18. The method of claim 17, wherein the BARC layer is designed such that a top electrical potential Φ of the e-beam sensitive resist layer is substantially zero during the e-beam patterning process.

19. The method of claim 17, wherein the BARC layer is designed such that Φ is substantially zero, wherein Φ is defined by $$\Phi = \frac{Q_p}{C_p} - \sum \frac{Q_{ni}}{C_{ni}},$$

wherein
Φ is an electrical potential of the e-beam sensitive resist layer at a top surface;
$Q_p$ is a positive charge in the e-beam sensitive resist layer;
$Q_{ni}$ is a negative charge in an "i" film;
$C_p$ is a capacitance of the multi-film dielectric layer and the resist layer regarding to the positive charge;
$C_{ni}$ is a capacitance of the "i" film; and
"i" is an integer number.

20. The method of claim 17, wherein the first and third dielectric constants are the same.

* * * * *